United States Patent [19]

Bell et al.

[11] Patent Number: 4,623,842

[45] Date of Patent: Nov. 18, 1986

[54] MAGNETOMETER ARRAY WITH MAGNETIC FIELD SENSORS ON ELONGATE SUPPORT

[75] Inventors: Malcolm E. Bell; John E. McFee; Henry W. Morewood; Clayton G. Coffey, all of Medicine Hat, Canada

[73] Assignee: Her Majesty the Queen in right of Canada, Alberta, Canada

[21] Appl. No.: 524,779

[22] Filed: Aug. 19, 1983

[30] Foreign Application Priority Data

Aug. 27, 1982 [CA] Canada ................................. 410334

[51] Int. Cl.$^4$ ........................................... G01R 33/04
[52] U.S. Cl. .................................. 324/245; 324/253; 33/356; 33/361
[58] Field of Search ................................ 324/245–247, 324/253–255, 257, 260, 261, 248, 252; 33/356, 361; 340/941

[56] References Cited

U.S. PATENT DOCUMENTS

| | | | |
|---|---|---|---|
| 2,414,654 | 1/1947 | Meredith | 324/253 |
| 2,427,666 | 9/1947 | Felch, Jr. et al. | 324/345 X |
| 2,998,727 | 9/1961 | Baker | 33/356 X |
| 3,078,949 | 2/1963 | Gray | 340/941 X |
| 3,281,660 | 10/1966 | Studenick | 324/345 X |
| 3,329,929 | 7/1967 | Burnett | 324/326 X |
| 3,744,312 | 7/1973 | Anderson | 33/356 X |
| 3,959,889 | 6/1976 | Thomas | 324/253 X |

OTHER PUBLICATIONS

"Traffic Control Systems Handbook", U.S. Dept. of Transportation, Jun., 1976, p. 335.

Primary Examiner—Reinhard J. Eisenzopf
Assistant Examiner—Warren Edmonds
Attorney, Agent, or Firm—Cushman, Darby & Cushman

[57] ABSTRACT

A fluxgate magnetometer with a linear array of three sensors equi-spaced along a support beam and accurately adjustable into the same spatial orientation for sensing magnetic field anomalies and/or for measuring a single axis component of a magnetic field at two or more points in space. The beam is mounted in an elongate housing provided with pairs of wedges, acting in opposition to one another at opposite ends of the beam, for flexing the beam to adjust the sensors, which have drive windings in containers secured to the beam, the drive windings being rotatably adjustable in their containers relative to sense windings and feedback windings.

8 Claims, 11 Drawing Figures

MAGNETOMETER ARRAY WITH MAGNETIC FIELD SENSORS ON ELONGATE SUPPORT

The present invention relates to apparatus for sensing a magnetic field and, more particularly, to fluxgate magnetometers.

In the fields of archaeology, forensic science, geological exploration, mine detection, submarine detection and range clearance, for example, there exists the need to determine remotely the position, magnetic strength and orientation of a magentic anomaly and, more particularly, to determine the position, magnitude and orientation of a magnetic dipole moment.

In the past, attempts have been made to achieve this by measuring a magnetic field associated with the magnetic anomaly using one or more magnetic sensors.

For example, magnetic sensors which measure the absolute value of the ambient magnetic field (total field magnetometers) may be employed, such sensors including cesium vapour magnetometers, rubidium vapour magnetometers and proton precession magnetometers.

For measuring a single magnetic component of the ambient magnetic field, vector magnetometers including super-conducting quantum interference devices and fluxgate magnetometers, may be employed.

Provided the magnetic field of the anomaly, superimposed on the ambient magnetic field, can be measured with sufficient sensitivity, then a method is required to utilize the magnetic field anomaly measurement to determine the information about the anomaly. However, no existing magnetometer or gradiometer has the ability to determine the dipole parameters, i.e. the dipole size, location and orientation, directly in real or pseudo-real time, and therefore they can only be used to determine rough estimates of the dipole size and position.

More particularly, any available array of three or more magnetometer sensors would have to employ stationary measurements to determine rough estimates of the dipole parameters, since the sensors would not be sufficiently accurately orientated one with respect to the others.

At the present time, there is commercially available a magnetometer having two sensors, manufactured and sold under the name: "Search Instrument FEREX 4.021" by Institut Dr. Forster of Reutlingen, Germany, which enables two sensors to be sufficiently accurately aligned to obtain accurate magnetic field measurements while moving. However, this prior art magnetometer is limited by the number of sensors, the sensor configuration and the necessity for the operator to make educated guesses based on the readings obtained.

For the particular case of a magnetic dipole, the same profile, i.e. magnetic data along single line, may be generated by more than one combination of dipole parameters. At least two sensors are required to uniquely determine the dipole parameters. In the presence of noise, more than two sensors are desirable to increase the accuracy obtainable from a fixed number of measurements.

However, prior art magnetometers employing two sensors are not sufficiently accurate because of finite signal-to-noise ratios, inherent in the sensors and electronic circuitry associated with sensors.

There also exists a need to measure a single axis component of a magnetic field at two or more points in space simultaneously and while the sensors are in motion and in real time. In practice, the measurement of the magnetic field at each point must be of the same field component to within 0.001 degrees, even when the angle between the measured axis and the total field of direction changes only slightly.

Prior art magnetometers employed for that purpose have only two magnetometer sensors and can only measure the magnetic field component at two points in space with the sensitive axes of the sensors and the axis joining the sensors co-axial, but not with the sensitive axes of the sensors parallel and the axis joining the sensors orthogonal to the sensitive axes of the sensors.

It is accordingly an object of the present invention to provide novel improved apparatus for sensing a magnetic field which mitigates at least some of the above-described disadvantages of the prior art apparatus.

According to the present invention, there is provided an array of three magnetic field sensors, two of which can be adjusted independently of one another into at least substantially the same spatial orientation as the third sensor.

This allows one of the sensors to be used for subtracting background fluctuations, while the other two are utilized to measure anomaly field values to allow non-ambiguous determination of dipole parameters. In practice, three sensors allow more accurate determination of dipole parameters for the same number of samples along a traverse than is possible with apparatus having only one or two sensors.

More particularly, according to the present invention there is provided apparatus for sensing magnetic field, comprising an elongate support, an array of three magnetic field sensors spaced apart along the magnetic support, means for adjusting two of the sensors independently of one another into at least substantially the same spatial orientation as the third one of the sensors, and means for obtaining from the sensors electrical signals corresponding to the magnetic field.

In a preferred embodiment of the invention, the sensors are fluxgate magnetometer sensors, two of which are disposed at opposite ends of the array and a third one of which is disposed intermediate the two end sensors, and the two end sensors are adjustable about three mutually orthogonal axes to bring the sensitive axes of the three sensors into at least substantially the same spatial orientation. The adjustment of the two end sensors is effected by flexing the elongate support and, for this purpose, pairs of wedges acting in opposition to one another are provided at opposite ends of the support. By this means, a fluxgate magnetometer can be made which allows the three sensors to be adjusted relative to each other with an accuracy of at least 0.0003 degrees on each of the three mutually orthogonal axes. Consequently, for variations in the orientation of the support of up to 10 degrees about these three axes, the difference between baseline signals at any two of the sensors due to the earth ambient field will fluctuate by no more than 0.1 nT, which corresponds to a common-mode-rejection ratio of at least $6 \times 10^5$.

The invention will be more readily understood from the following description of a preferred embodiment thereof illustrated, by way of example, in the accompanying drawings, in which.

Figure 1:
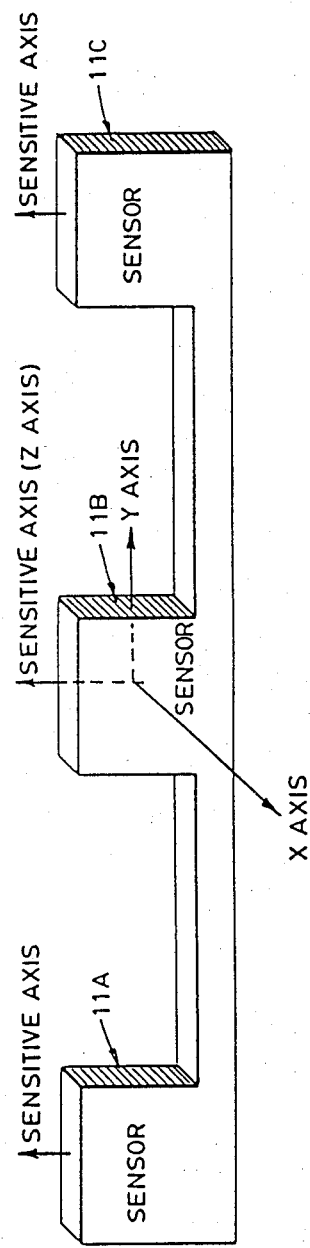
FIG. 1 shows a diagrammatic view in perspective of a three sensor array on an elongate support.

Referring firstly to FIG. 1 of the accompanying drawings, there is shown an elongate support in the form of a beam, indicated generally by reference 10, on which three fluxgate magnetometer sensors, indicated generally by reference numerals 11A, 11B and 11C, are provided. The sensors 11A, 11B and 11C are spaced apart along the beam 10, with the sensors 11A and 11C at opposite ends of the beam 10 and the sensor 11B midway intermediate sensors 11A and 11C.

As shown in FIG. 1, the sensor 11B has three mutually orthogonal axis X, Y and Z, of which the axis Z coincides with the senstive axis of the sensor 11B, the sensitive axes 11A and 11C being parallel to that of the sensor 11B.

Figure 2:
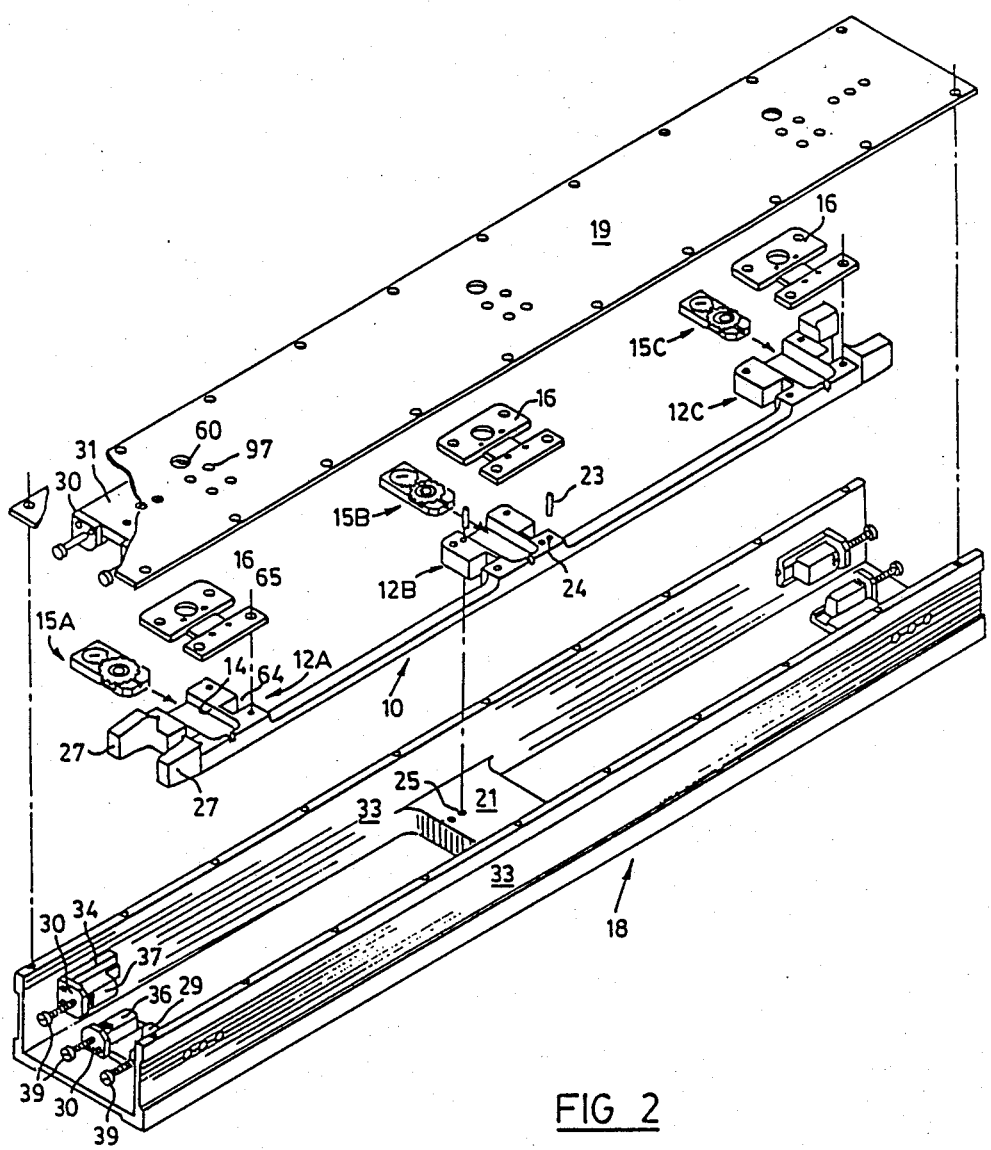
FIG. 2 shows a view in perspective of an embodiment of the invention, incorporating the array of FIG. 1, with components shown separated from one another to facilitate comprehension.

The beam 10 is illustrated in greater detail in FIG. 2, from which it can be seen that the beam 10 is formed with three cassette holders in the form of integral lateral projections indicated generally by reference numerals 12A, 12B and 12C, which are formed with equi-spaced slots 14 for receiving friction fit cassettes indicated generally by reference numerals 15A, 15B and 15C. Cover plates 16 are provided for releasably securing the cassettes 15A, 15B and 15C in the projections 12A, 12B and 12C.

Figure 3:
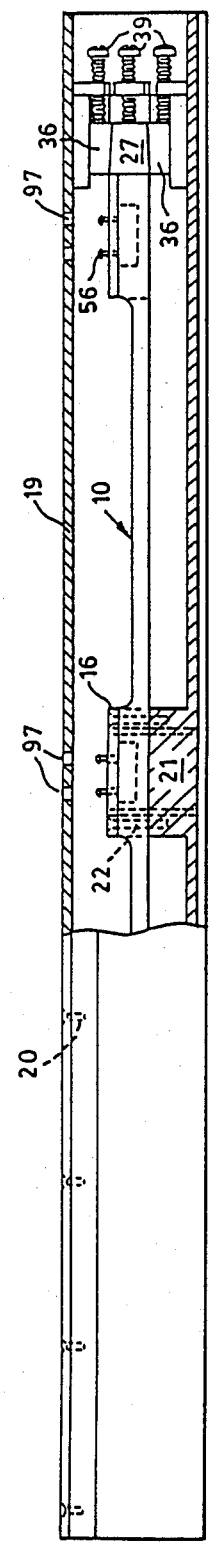
FIGS. 3 and 4 show, respectively, a side view and a plan view, partially broken away in section, of the embodiment of FIG. 2 in an assembled condition.
Figure 4:
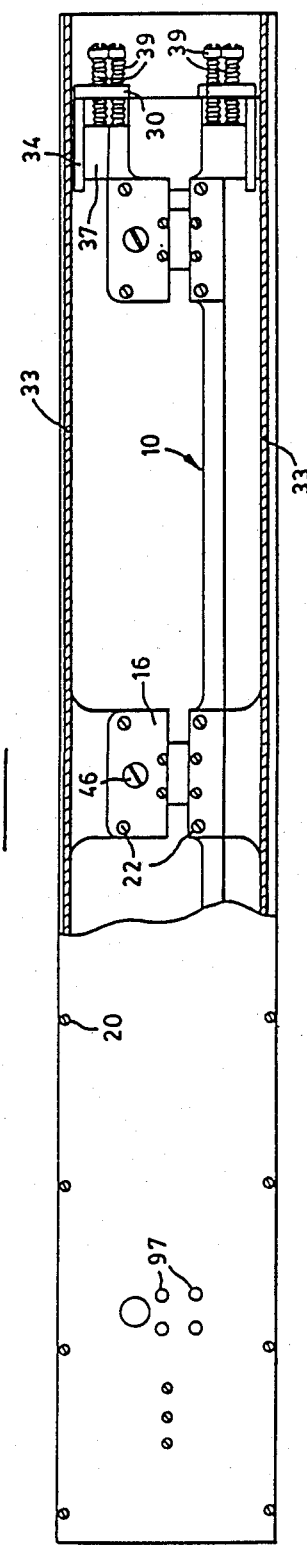

An elongate housing indicated generally by reference 18, and which is open-ended and open-topped, is provided for receiving the beam 10 and, when the apparatus is assembled as shown in FIGS. 3 and 4, a housing cover 19 is secured across the top of the housing 18 by screws 20.

The bottom of the housing 18 is formed with an integral platform 21 on which the midportion of the beam 10 and the projection 12B are mounted and secured by screws 22, locating pins 23 being inserted through bores 24 in the beam 10 and bores 25 in the platform 21 for accurately locating the beam 10 in the housing 18.

The lateral projections 12A and 12C are each formed with a pair of laterally spaced, longitudinally extending projections 27, which co-operate with wedges, as described in greater detail below.

A guide plate 29 is screwed to the top surface of the bottom of the housing 18 at each end of the housing 18, and a pair of vertical brackets 30 are secured by screws to each of the guide plates 29.

Above each of the guide plates 29, a further guide plate 31 is secured by screws to the underside of the housing cover 19, and a pair of brackets 30 are secured by screws to each of the guide plates 31.

The housing 18 has opposed side walls 33, and at each end of the housing 18 a pair of rocker plates 34 are mounted on respective brackets 35 (see FIG. 5) which are secured by screws (not shown) to the opposed inner faces of the housing side walls 33, brackets 30 being secured by screws to the rocker plates 34.

Each of the guide plates 29 and 31 is provided with a pair of wedges 36, which are slidable along guide grooves in the respective guide plates 29 and 31. Each of the rocker plates 34 is provided with a respective wedge 37, the wedges 37 being slideably engaged with the rocker plates 34 by means of tongue and groove connections.

Adjustment screws 39 in threaded engagement with the brackets 30 are provided for effecting the sliding of the wedges 36 and 37, the adjustment screws 39 being formed with heads 40 (see FIG. 5) which are releasably engaged in slots 41 in the wedges 36 and 37 so as to effect sliding displacement of the latter, in the longitudinal direction of the housing 18, upon rotation of adjustment screws 39 relative to their respective brackets 30.

The wedges 36 carried by the housing cover plate 19 are in wedging contact with corresponding tapered surfaces on the tops of the longitudinal projections 27 of the beam 10 and the remaining wedges 36 are in wedging contact with the under sides of the longitudinal projections 27, the wedges 37 being in wedging contact with corresponding tapered surfaces of the laterally outermost sides of the longitudinal projections 27.

The cassette 15A, which is shown in greater detail in FIGS. 6 and 7, will now be described and it is to be understood that the description of the cassette 15A, which is similar to the cassettes 15B and 15C, also applies to the latter.

Figure 6:
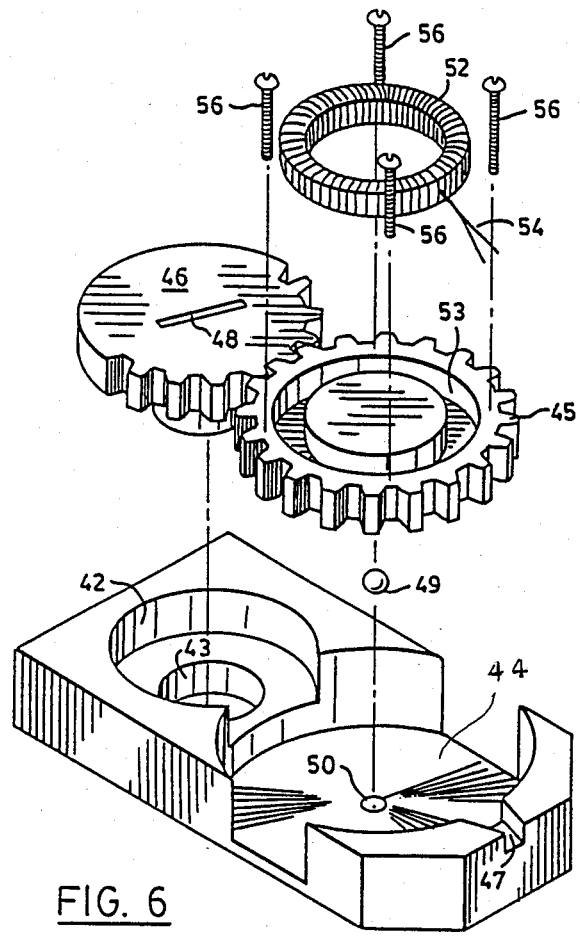
FIG. 6 shows a view in perspective of parts of the embodiment of FIG. 2 unassembled condition.

The cassette 15A is formed with an upwardly-open generally cylindrical recess 44, from which a slot 47 extends, at the top of the cassette 15A, to the front end of the cassette 15A, as viewed in FIG. 6.

The cylindrical recess 44 intersects a counterbore 42 coaxial with a bore 43 and accommodates a torroid gear 45 meshing with an adjusting gear 46, which is accommodated in the bore 43 and counterbore 42, the adjusting gear 46 being formed with a slot 48 for receiving the tip of a screwdriver for rotating the adjusting gear 46 and, thus, the torroid gear 45. A copper ball 49 is interposed between the underside of the torroid gear 45 and a segmental spherical depression 50 in the bottom of the cylindrical recess 44 for rotatably supporting the torroid gear 45 on the cassette 15A.

A fluxgate magnetometer sensor drive winding on an annular core (not shown) forms a toroid coil 52 which is accommodated in an annular recess 53 formed in the top of the torroid gear 45, leads 54 of the drive winding projecting through the slot 41.

The cassette cover plate 16 is secured by screws to the beam lateral projection 12A, and four adjustment screws 56 in threaded engagement with the cover plate 16 bear, at their lowermost ends, against the upper surface of the torroid gear 45.

Figure 7:
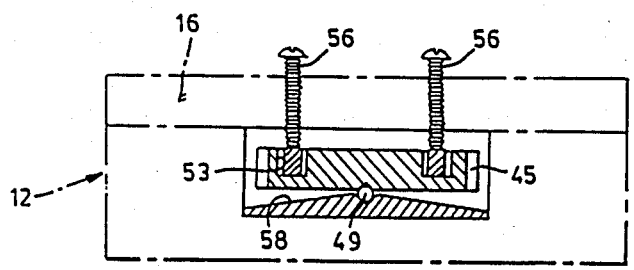
FIG. 7 shows a view taken in cross-section through parts of the embodiment of FIG. 6 shown in an assembled condition.

As can be seen from FIG. 7, the bottom of the cylindrical recess 40, which is indicated by reference 58 in FIG. 7, has a frusto-conical, convex shape, so that by adjustment of the screws 56, the torroid gear 45 and thus the toroid coil 52 can be tilted about the centre of the ball 49.

As can be seen from FIG. 2, the housing cover plate 19 and the cassette cover plates 16 are formed with circular openings 60 and 61, which are vertically aligned with the adjustment gears 46 to allow insertion of a screwdriver through the housing cover plate 19 and the cassette cover plates 16 for rotating the adjustment gears 46 of the three cassettes.

The beam lateral projections 12A, 12B and 12C, which as will be apparent from the above description form holders for the three cassettes, are formed with slots 64, which are aligned with slots 65 in the cassette cover plates 16, and sense and feedback windings 66 (FIG. 5) of the three sensors are wound around the lateral projection 12A, 12B and 12C and the cassette cover plates 16, in the slots 64 and 65. The entire apparatus, with the exception of the pivot balls 49, the annular cores, the drive windings conductors (not shown), is made of the same material to ensure uniform thermal expansion and contraction, since non-uniform expansion and contraction could result in inaccuracies in the orientations of the three sensors 11A, 11B and 11C.

Figure 8:
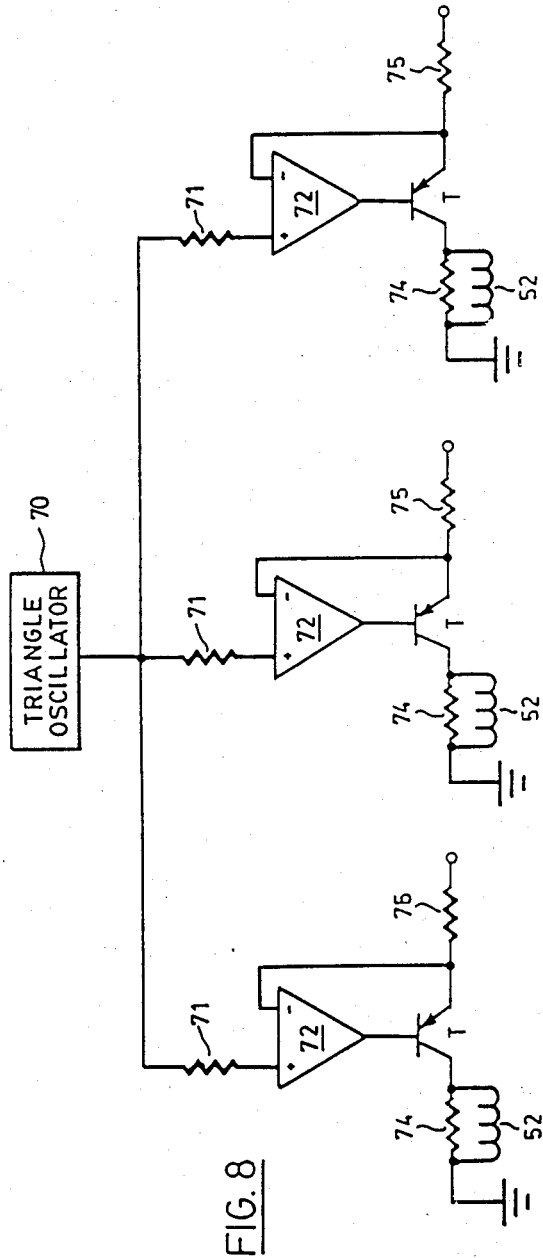
FIG. 8 shows a circuit diagram of a drive circuit for energizing the sensors of the embodiment of FIG. 2.

FIG. 8 shows the circuit diagram of a drive circuit for energizing the toroid coil 52 of the three fluxgate magnetometer sensors 11A, 11B and 11C.

As shown in FIG. 8, a triangle oscillator 70 has its output connected through resistors 71 to one input of each of three operational amplifiers 72. Each operational amplifier 72 has an output connected to the base of a transistor T, the collector of which is connected through a resistor 74 to ground, the respective toroid coil 52 being connected across the resistor 74. The positive power supply terminal is connected through resistors 75 to the emitters of each Transistor T. and an input of the respective operational amplifier 72.

Each operational amplifier 72, together with its associated Transistor T and resistors 71, 75, forms a voltage-to-current converter, which provides a triangular current output at the collector of the respective transistor T for energizing the respective toroid coil 52. The triangular current wave-forms in the toroid coil drive windings periodically drive the toroid cores in and out of saturation for fluxgate operation, as will be apparent to those skilled in the art. Resistors 74 damp their respective toroid coils to reduce ringing.

Figure 9:
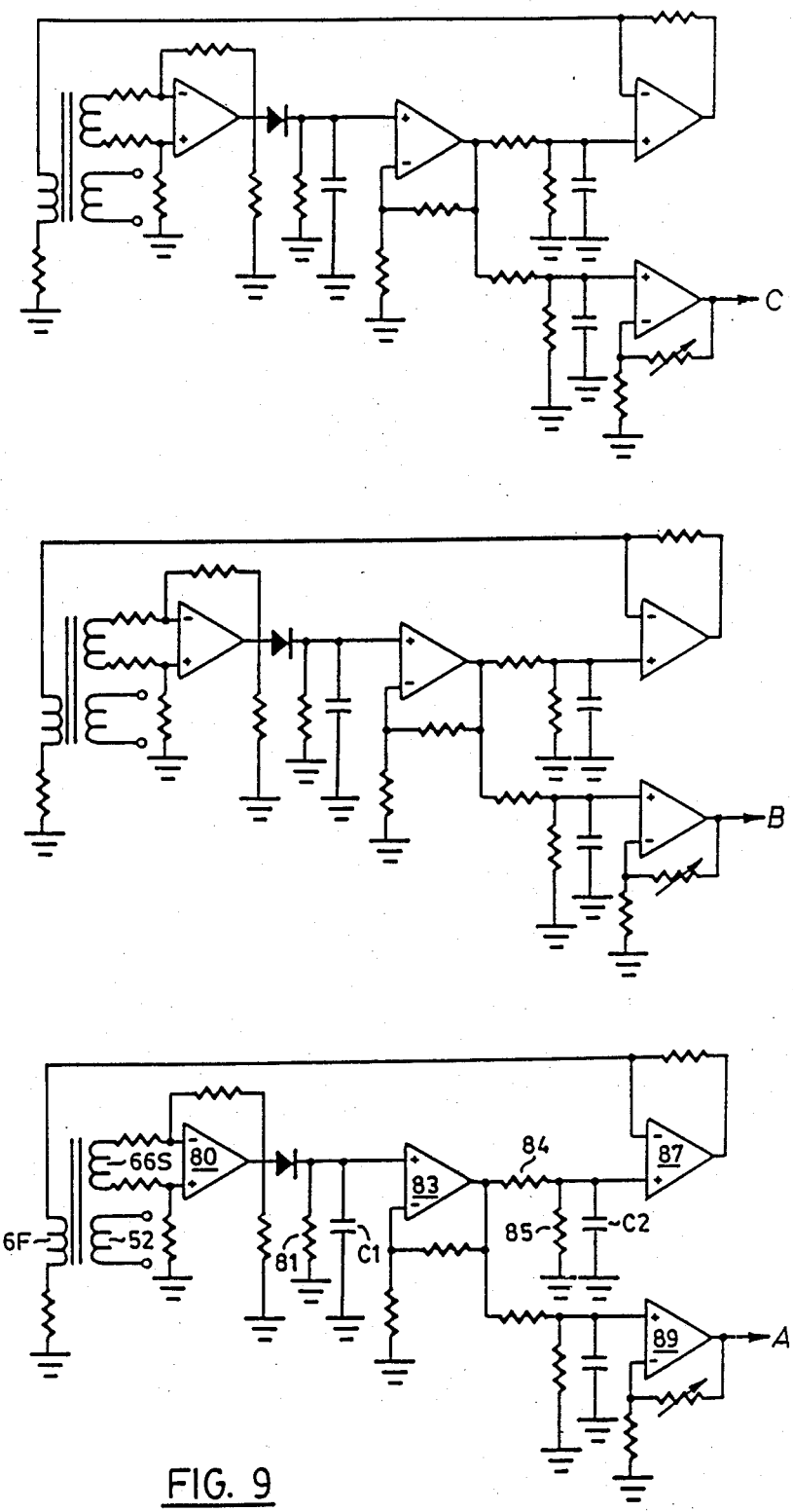
FIG. 9 shows a circuit diagram of a sense and feedback circuit of one of the sensors of the embodiment shown in FIG. 2.

FIG. 9 shows the sense and feedback circuitry of the sensor 11A, and it is to be understood that the sensors 11B and 11C are provided with similar circuitry.

Figure 5:
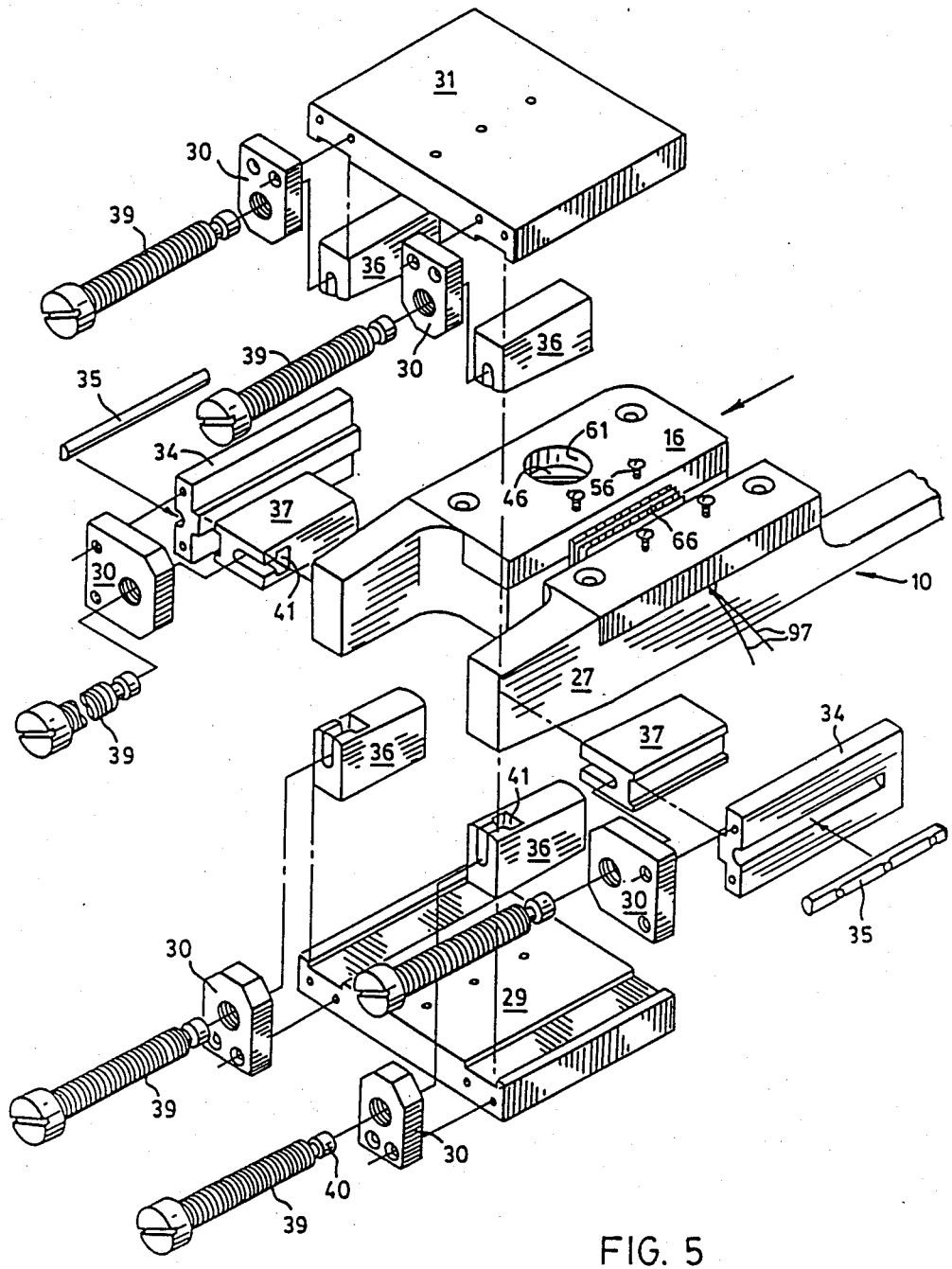
FIG. 5 shows a view in perspective of parts of the embodiment of FIG. 2 in an assembled condition.

In FIG. 9, the sense and feedback windings of the sensor 11A, which together are indicated by reference 66 in FIG. 5, are indicated by reference numerals 66S and 66F, respectively.

The sense winding 66S, which rejects the driving wave-forms fundamental frequency and odd harmonics but amplifies the harmonics which correspond to the ambient magnetic field, is connected to differential amplifier 80, differential amplifier 80 amplifies the harmonics which correspond to the ambient magnetic field.

A peak detector formed by a diode, resistor 81 and capacitor C1, converts the AC wave-form output of the differential amplifier 80 into a DC voltage, which is amplified by an amplifier 83. Resistors 84 and 85 and capacitor C2 provide additional low pass filtering of the output of the amplifier 83, which is applied to amplifier 87, the voltage on the positive input terminal of amplifier 87 being proportional to the ambient magnetic field. An increase in the ambient magnetic field value causes a voltage increase at the positive terminal of the feedback amplifier 87, the negative terminal voltage of which will then increase to maintain balanced input currents. This will increase the current in the feedback winding 66F and increase the magnetic feedback field associated with the sense winding 66S.

Likewise, a decrease in voltage on the positive terminal of the feedback amplifier 87 will cause a decrease in the magnetic feedback field produced by the feedback winding 66F.

The magnetic feedback field, $H_F$, of the feedback winding 66F has approximately the same magnitude as the ambient magnetic field, $H_Z$ at the sense coil 66F. Since the fields $H_F$ and $H_Z$ are 180° out of phase, the sense coil 66S operates as a null detector and the differential amplifier 80 amplifies the difference $H_Z - H_F$ sensed by the sense coil 66S. This amplified difference signal continuously adjusts the current in the feedback coil 66F, so that the magnetic feedback field $H_F$ tracks the ambient magnetic field $H_Z$.

The fields $H_Z$ and $H_F$ are proportional to the voltage output of amplifier 89.

Preferably, the above-described sense and feedback circuit is interconnected with the corresponding circuits of the other two sensors 11B and 11C in a magnetometer multisensor feedback system such as that disclosed in Canadian Patent Application No. 345,355, filed Jan. 29, 1980 (U.S. patent application Ser. No. 211,938 filed Dec. 1, 1980 now U.S. Pat. No. 4,380,735), the disclosure of which is incorporated herein by reference, in which, for each sensor, electrical signals corresponding to the feedback fields of the other two sensors are employed to compensate feedback interference between the feedback fields of the feedback windings.

The adjustment of the above-described apparatus to prepare it for operation will now be described with reference to FIGS. 10 and 11.

Figure 10:
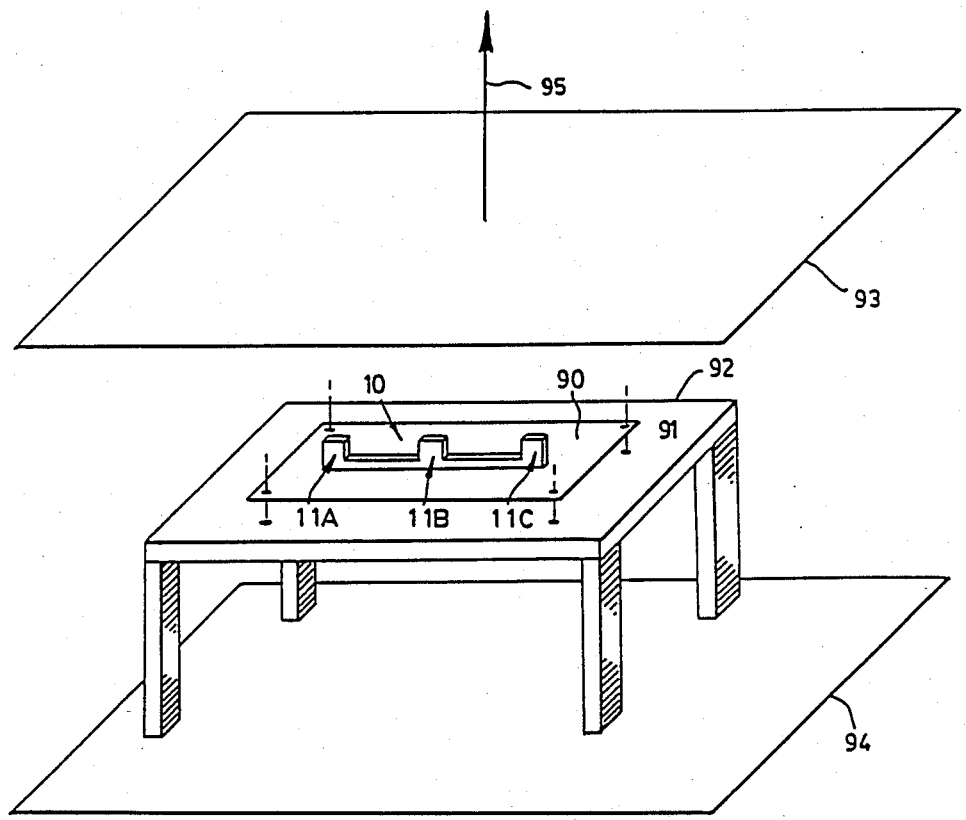
FIG. 10 shows a diagrammatic view in perspective of an arrangement for use in calibrating and orienting the sensors of the embodiment of FIG. 2.

As diagramatically illustrated in FIG. 10, the beam 11 is placed on an alignment platform, which is rigid and constructed from aluminium or other non-magnetic material and provided at each corner with a screw-in type adjustable leg 91, by means of which the position of the platform 90 can be adjusted.

The platform 90 is mounted on a table 92 which, in turn, is positioned between upper and lower Helmholtz coils 93 and 94, having a Helmholtz axis 95.

Upper and lower Helmholtz coils 93 and 94 are employed to provide a stable AC magnetic field, which is required for the calibration and orientation adjustment of the three sensors 11A, 11B and 11C. This magnetic field, serving as a reference magnetic field, should be a low-distortion sine wave at a frequency within the magnetometer's pass band and should have an amplitude of at least 500 nT pp and a maximum temporal deviation of 0.01%.

The reference magnetic field direction is parallel to the Helmholtz axis 95 and, ideally, the Helmholtz coils 93 and 94 should not generate fields which are orthogonal to the Helmholtz axis 95. Also, the Helmholtz coils 93 and 94 should be sufficiently large to provide the reference magnetic field with a uniform amplitude and direction throughout a volume of space surrounding the sensors and illustrated as an alignment region 98 in FIG. 11. This alignment region 98 is centrally located within the Helmholtz coils.

The magnetic field in the alignment region 98 is uniform within the tolerance specified by the maximum magnetic field gradient (hz) as defined below. In this case, hz is 0.001.

Figure 11:
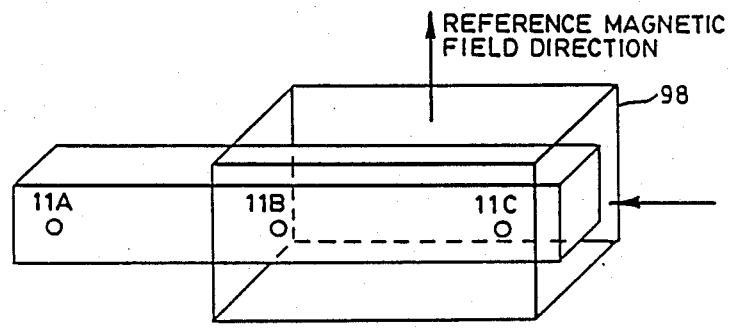
FIG. 11 shows a diagrammatic view in perspective of the magnotometer array of the embodiment of FIG. 2 during such calibration and orientation.

The alignment region must be large enough to contain two magnetometer array sensors as shown in FIG. 11. A region which is 30 cm by 30 cm and 10 cm high is adequate for a sensor spacing of 25 cm.

Having determined the requirements for hz and the alignment region size (x,y,z) the Helmholtz coil size can be calculated from the following formula.

$$\left\{ \left| a = \frac{-0.400\,(x^4 + y^4) - 0.807\,z^4 - 0.193\,x^2y^2 + 2.42\,z^2}{\frac{(x^2 + y^2)^{\frac{1}{4}}}{hz}} \right| \right\}$$

where
$a = \frac{1}{2}$ length of one side of square Helmholtz coil (meters)
$x,y,z = \frac{1}{2}$ length of uniform gradient region centrally located within square Helmholtz coil (z is height) (meters).

$hz$ = magnetic field inhomogenity of uniform field region $$\left( \text{expressed as } \frac{\text{inhomogenity}}{\text{total field}} \right)$$

$$\text{eg. } hz = \frac{1\gamma}{1000\gamma} = 0.001$$

As diagramatically illustrated in FIG. 10, the beam 10 is placed in the alignment region and on an alignment platform 90, which is rigid and constructed from aluminum or other non-magnetic material and provided at each corner with a screw-in type adjustable leg 91, by means of which the position of the platform 90 can be adjusted.

The platform 90 is mounted on a non-magnetic table 92 which, in turn, is positioned between the upper and lower Helmholtz coils 93 and 94.

The toroid coils 52 are firstly adjusted in position with respect to their respective sense windings 66S.

This is effected by loosening the screws 56, through holes 97 in the housing cover 19, to allow rotation of the adjusting gear 46, which is then rotated until the odd harmonics corresponding to the drive wave-form are minimized as shown by a spectrum analyzer employed for observing the signal on the respective sense winding 66S. The screws 56 are then tightened to secure the toroid in position.

This procedure is repeated for each of the sensors.

The toroid coil of sensor 11B is then oriented so that its sensitive axis is parallel with the sensitive axis of the sensor 11B of the sense coul 66S. The sensitive axis of the sense winding 66S of sensor 11B is first aligned with the Helmholtz axis 95 by adjustment of the platform legs 91 until the AC reference output voltage of that sensor which corresponds to the reference magnetic field, is maximized. The sensitive axis of the toroid coil 52 of sensor 11B is then aligned with the Helmholtz axis 95 any adjustment of the toroid alignment screws 56 until the AC reference output voltage of that sensor is maximized. The legs 91 and the screws 56 are then repeatedly adjusted to maximize the AC reference output voltage of sensor 11B.

This procedure is repeated for sensors 11A and 11C.

The sensors 11A and 11B are then both placed in the alignment region and the legs 91 are adjusted to obtain the maximum reference voltage from sensor 11B, so that the sensitive axis of sensor 11B is parallel to the Helmholtz axis. The wedges 37 are then adjusted to maximize the reference voltage output of sensor 11A, and the wedges 36 are then adjusted, the wedges 37 are readjusted and the wedges 36 are readjusted for the same purpose.

In this connection, with reference to FIGS. 1 and 2, the adjustment of the wedges 37 has the effect of rotating the respective beam end about the X axis, the wedges 37 working in opposition to allow a high degree of accuracy to be maintained. As will be apparent, one of the wedges 37 must be loosened before the other wedge 37 can be tightened.

The wedges 36 can be adjusted to rotate the respective end of the beam 10 about the Y axis with respect to the centre of the beam 10. For this purpose, the wedge 36 disposed to one end of the housing and beneath the beam 10 and the wedge 36 disposed to the other side of the housing and above the beam 10 are tightened, while the other two wedges 36 are loosened.

In addition, the wedges 36 can be adjusted to rotate the beam about the Z axis, the wedges 36 associated with the guide plate 31 being tightened while those associated with the guide plate 29 are loosened, or vice versa, for this purpose.

In the present embodiment of the invention, the beam 10 has a length of 50 cm., the screws 39 have a pitch of forty threads per inch and the wedges 36 and 37 have an angle of taper of 2.5 degrees, so that one rotation of one of the adjusting screws 39 has the effect of displacing the respective beam end through $6.35 \times 10^{-3}$ degrees with respect to the centre of the beam 10. Consequently, displacements as small as $3 \times 10^{-4}$ degrees, corresponding to a rotation of one of the adjusting screws 39 through 15 degrees, are readily achievable in each direction.

The sensor 11C is then orientated relative to the sensor 11B in the same manner as described above with respect to the sensor 11A.

The apparatus is then removed from the platform 90 and from between the Helmholtz coils 93 and 94 and with the apparatus still in a magnetic field gradient-free location, and to effect fine adjustment of the sense windings 66S, the difference between the outputs of the sensors 11A ahd 11B is measured and the entire magnetometer is raised and rotated through 10 degrees about the X axis. If the value of the difference signal deviates more than 0.1 nT from the baseline, the wedges 37 are adjusted to minimize the deviation.

The magnetometer is raised and tilted through 10 degrees about the Y axis and, if the value of the difference signal deviates by more than 0.1 nT from the baseline, the wedges 36 are adjusted to minimize the deviation.

These two procedures are then repeated until the deviation is minimized, and corresponding procedures are then performed to effect fine adjustment of the sense windings 66S of the sensors 11B and 11C.

The above described apparatus can be employed to measure the same single axis component of a magnetic field at three points in space, these field values being measured simultaneously and in real time.

In addition, the apparatus can be employed to measure the defined field component at the three points in space in real time even while the angle between the sensors sensitive axes and the ambient field direction is changing.

In addition, algorithms and techniques are available (see J. E. McFee and Y. Das, "Determination of the Parameters of a Dipole by Measurement of Its Magnetic Field", *IEEE Trans* March 1981; A. D. McAulay, "Computerized Model Demonstrating Magnetic Submarine Localization", *IEEE Trans Aerospace and Electronic Systems AES*-13, pp 246–254, May 1977; and W. Wynn, C. Frahm, P. Carroll, R. Clark, J. Wellhoner and M. Wynn, "Advanced Superconducting Gradiometer/Magnetometer Arrays and a Novel Signal Processing Technique", *IEEE Trans. Mag. MAG*-11 pp 701–707, March 1975) for processing magnetic data obtained by the magnetometer to determine the parameters of a dipole, and other published procedures are available (see S. Parker Gay Jr. "Standard Curves for Interpretation of Magnetic Anomalies over Long Tabular Bodies" pp 512–548; R. Henderson and I. Zietz, "Polar Charts for Calculating Aeromagnetic Anomalies of Three-Dimensional Bodies" pp 554–568; R. Henderson and I. Zietz, "Magnetic-Doublet Theory in Analysis of Total Intensity Anomalies" pp 490–511 all in *Mining Geophysics*, The Society of Exploration Geophysicists, Tulsa, Okla., 1967; and G. Ioannidis, "Identification of a Ship or Submarine from Its Magnetic Signatures", *IEEE Trans Aerospace and Electronic Systems AES*-13, pp 328–329, May 1977) to determine size and shape characteristics of magnetic anomaly distributions other than an isolated dipole.

While, in the above described embodiment of the invention, the sensitive axes of the three sensors are parallel to the Z axis, one alternative would be an embodiment in which these sensitive axes are parallel to the Y axis.

It has been found in practice that the sensors can be aligned to at least 0.0003 degrees on all three axes and consequently, for variations of the beam orientation of up to 10 degrees about all three axes, the difference between baseline signals at any two of the sensors due to the earth's ambient field will fluctuate by no more than 0.1 nT, which corresponds to a common-mode-rejection ratio of at least $6 \times 10^{-5}$. The sensors themselves are inexpensive and the beam 10 can be made inexpensively by using composite materials.

The embodiments of the invention in which an exclusive property or privilege is claimed are defined as follows:

1. Apparatus for sensing a magnetic field, comprising:
   an elongate support;
   an array of three magnetic field sensors mounted on said support in spaced apart relation along said elongate support at opposite end portions and an intermediate portion;
   means for adjusting the position of two of said sensors independently of one another into at least substantially the same spatial orientation as the third one of said sensors including at least a pair of wedges acting on opposite surfaces of each said end portion for torsionally deflecting said end portions relative to said intermediate portion; and
   means for deriving from said sensors electrical signals corresponding to the sensed magnetic field.

2. Apparatus as claimed in claim 1, wherein said sensors comprise fluxgate sensors having sense windings and drive windings and means are provided for rotatably adjusting said drive windings relative to said sense windings.

3. Apparatus as claimed in claim 2, wherein each of said drive windings comprises a toroidal coil, said apparatus further comprising three coil container means for holding respective ones of said coils and means for adjustably securing said container means to said support, and said rotatable adjustment comprise gear means are provided in said container means for rotatably adjusting said coils relative to said container means.

4. A fluxgate magnetometer, comprising:
   an elongate support;
   an elongate housing containing said support;
   means acting between said support and said housing for flexing said support including a plurality of wedge members at each end of said support and screw means for urging said sedging members into wedging engagement with said support;
   a linear array of three fluxgate magnetometer sensors mounted on said supported in spaced apart relation along said support so that two of said sensors are disposed at opposite ends of said array and a third one of said sensors is disposed intermediate said two sensors;
   said sensors each having a respective sensitive axis;
   means for adjusting said two sensors about three mutually orthogonal axes to bring the sensitive axes of said three sensors into at least substantially the same spatial orientation; and
   means for deriving from said sensors electrical signals corresponding to a magnetic field sensed by said magnetometer.

5. A fluxgate magnetometer as claimed in claim 4, wherein each of said sensors comprises a core, a drive winding on said core, a sense winding and a feedback winding and means associated with said drive winding for cyclically saturating said core, sense circuit means responsive to asymetrical voltages in said sense winding and feedback circuit means connected to said feedback winding for producing a magnetic feedback field to operate said sense winding as a null detector, and means are provided for adjustably aligning said drive windings with said sense windings.

6. A fluxgate magnetometer as claimed in claim 5, wherein said drive winding adjustment means comprise means for rotating said drive winding relative to said sense winding and said feedback winding.

7. A fluxgate magnetometer as claimed in claim 6, wherein each of said sensors comprises a container holding a respective one of said drive windings and said drive winding adjustment means comprise gear means in said containers for rotating said drive windings, said containers each including means for releasably adjustably fixing said drive windings relative to the respective containers and means being provided for releasably securing said containers to said support.

8. A fluxgate magnetometer as claimed in claim 4, wherein said wedge members are provided in oppositely acting pairs.

* * * * *